United States Patent
Han (10) Patent No.: US 6,236,574 B1
(45) Date of Patent: *May 22, 2001

(54) SUB PRINTED CIRCUIT BOARD FIXING DEVICE IN ELECTRONIC PRODUCTS

(75) Inventor: Sang-Hyun Han, Kyungki-do (KR)

(73) Assignee: SamSung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/910,665

(22) Filed: Aug. 13, 1997

(30) Foreign Application Priority Data

Aug. 13, 1996 (KR) ................................................ 96/33587

(51) Int. Cl.$^7$ ........................................................ H05K 9/00
(52) U.S. Cl. .......................... 361/816; 361/752; 361/759; 361/800; 361/801; 206/719
(58) Field of Search .................................. 361/728, 752, 361/753, 759, 801, 802, 816, 818, 825; 174/35 R, 52.1; 439/607–609, 62; 211/41.17; 206/719

(56) References Cited

U.S. PATENT DOCUMENTS

| | | | |
|---|---|---|---|
| 3,662,224 | * 5/1972 | Rauch | 361/741 |
| 4,048,669 | * 9/1977 | Bowler et al. | 361/726 |
| 4,389,080 | * 6/1983 | Clark et al. | 439/62 |
| 4,642,735 | * 2/1987 | Hodson et al. | 361/818 |
| 4,868,716 | * 9/1989 | Taylor et al. | 361/818 |
| 5,001,606 | * 3/1991 | Kreiner | 361/683 |
| 5,449,297 | * 9/1995 | Bellomo et al. | 493/630 |
| 5,590,023 | * 12/1996 | Hernandez et al. | 361/683 |
| 5,650,917 | * 7/1997 | Hsu | 361/759 |
| 5,726,865 | * 3/1998 | Webb et al. | 361/801 |
| 5,781,414 | * 7/1998 | Mills et al. | 361/786 |
| 5,829,601 | * 11/1998 | Yutchenco et al. | 211/41.17 |
| 5,943,218 | * 8/1999 | Liu | 361/801 |

* cited by examiner

Primary Examiner—Jayprakash N. Gandhi
(74) Attorney, Agent, or Firm—Robert E. Bushnell, Esq.

(57) ABSTRACT

A sub printed circuit board fixing device in an electronic product, the device includes: an electrical connection unit which is installed on a main printed circuit board, and where a sub circuit board is inserted; a connection unit which is formed in the lower part of the sub printed circuit board and is inserted into the electrical connection unit fixed to the main printed circuit board; a shield bracket for shielding the sub printed circuit board; and a fixing bracket which is installed on the main printed circuit board, for removably fixing the sub printed circuit board to which the shield bracket is fastened.

21 Claims, 6 Drawing Sheets

SUB PRINTED CIRCUIT BOARD FIXING DEVICE IN ELECTRONIC PRODUCTS

CLAIM OF PRIORITY

This application makes reference to, incorporates the same herein, and claims all benefits accruing under 35 U.S.C. §119 from an application for Sub Printed Circuit Board Fixing Device in Electronic Products earlier filed in the Korean Industrial Property Office on Aug. 13, 1997 and there duly assigned Serial No. 33587/1996.

FIELD OF THE INVENTION

The present invention relates to a sub printed circuit board (PCB) attachment device where a sub PCB is mounted on a main PCB in an electronic product such as a computer monitor. Specifically, this invention is a sub PCB attachment device in an electronic product, which couples a sub PCB to a main PCB using a shield and fixing brackets using a connector, thereby fastening the sub PCB more solidly, increasing a shield effect, and facilitating disassembly and assembly of the sub PCB, resulting in improvement of operation efficiency in repairing.

DISCUSSION OF RELATED ART

A general electronic product, such as a monitor, internally contains a main PCB where various circuit elements and parts are soldered, and a sub PCB, as an auxiliary PCB of the main PCB, where various circuit elements and contact connectors are soldered.

The sub PCB must be electrically connected to the main PCB. The sub PCB, where various elements are soldered, has its own weight, thus it must be firmly fastened to keep the electrical connection stable and decrease an inferiority rate in circuits caused by disconnection between the sub and main PCBs.

Since the sub PCB is fixed to the main PCB in a narrow space, it must be installed taking only a small space and facilitating disassembly in case of malfunction in a circuit of a product. Therefore, the sub PCB is vertically positioned on the main PCB so as not to take up too much space. However, when vertically standing the sub PCB, the various circuit elements can be dislocated in case of shock or a drop test for a product, depending on their weight. This prevents good connection in a circuit, causing malfunction in the product.

Since many wires are connected in the narrow space, the sub PCB must be installed to facilitate disassembly and assembly, thus improving operation efficiency in assembly or repair and giving convenience in use. To prevent electrical troubles with other parts when fixed on the main PCB, the sub PCB is surrounded by a shield bracket.

Recently, many circuit elements and parts are attached to the main PCB as an electronic product has a various function. Since the room in main PCB is limited, the sub PCB is demanded to be designed so that it takes the least space when it is connected to the main PCB where many circuit elements and parts have already been attached.

An earlier sub PCB fixing device is fixedly installed at a level with the chassis in an electric product. The sub PCB is vertically positioned on the one side of the main PCB, where many circuit elements are attached, in such a manner that the pin in the lower part of the sub PCB is inserted into the groove formed on the main PCB. The pin and groove are soldered to fix the sub PCB. A shield bracket surrounding the sub PCB is fixed on the main PCB in such a manner that it is inserted into holes formed on the main PCB and soldered, or using a special attachment unit.

Such an earlier sub PCB attachment device has the following problems. First, since the pin in the sub PCB is inserted into the groove in the main PCB and soldered, the efficiency in the connecting operation deteriorates. Since the soldered part must be melted in case of repair or disassembly, the operation efficiency in disassembly deteriorates, and repair is difficult. After a repair, the sub PCB must be soldered again. This is very inconvenient.

Second, the pin in the sub PCB can be dislocated, causing malfunction in a circuit in case of drop test or shock, because there is high possibility of the movement of the sub PCB fixed only by soldering. Moreover, the sub PCB is disconnected, thus damaging other parts or the main PCB, causing malfunction in the whole product.

Third, much space is demanded since a shield bracket must be installed on the main PCB, surrounding the sub PCB. The sub PCB and shield bracket are separated, not integrated, thus the shielding effect deteriorates.

Essentially, malfunction in a circuit occurs very frequently because solid fixation cannot be embodied by the earlier sub PCB fixing device. Soldering connection is the cause of deteriorating operation efficiency and makes repair difficult. The separate shield bracket and sub PCB occupy much space, decreasing available space. Shield effect deteriorates in the separate form, thus electrical malfunction with other parts occurs frequently, thereby deteriorating the quality and the degree of reliability in products.

SUMMARY OF THE INVENTION

An object is to provide a sub PCB fixing device which connects a sub PCB to a main PCB using a connector and uses a shield and support brackets for firm fixation, thereby increasing shield effect and facilitating disassembly and repair.

Another object is to attach a sub PCB to a main PCB and a shield to a sub PCB without the use of soldering.

To achieve these and other advantages, and in accordance with the purpose of the present invention as embodied and broadly described, a connector into which a sub PCB is inserted is installed on a main PCB; a connector pin is formed in the lower part of the sub PCB and inserted into the connector, for an electrical connection; the sub PCB is fastened to a shield bracket for shielding; and a fixing bracket having a catch and a garnering opening is installed on the main PCB.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
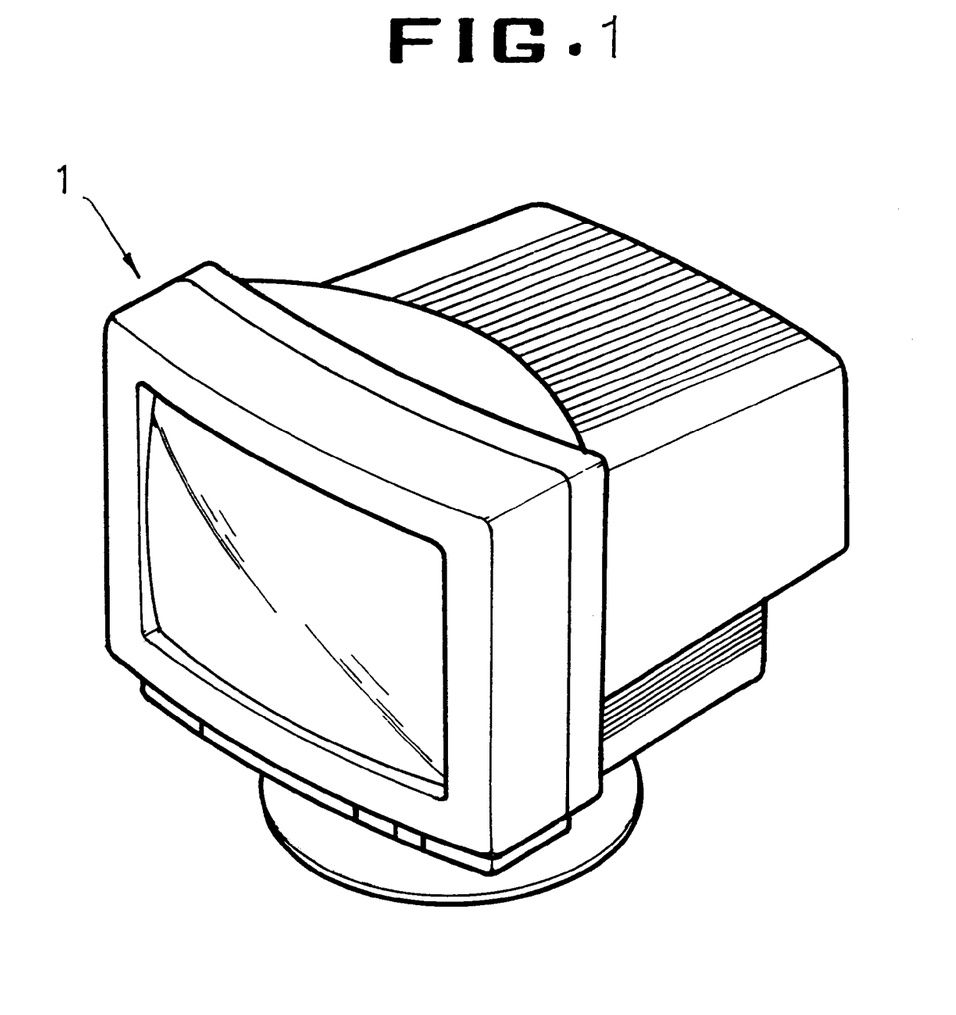
FIG. 1 is a perspective view of an electric production to which the present invention is applied.
Figure 2:
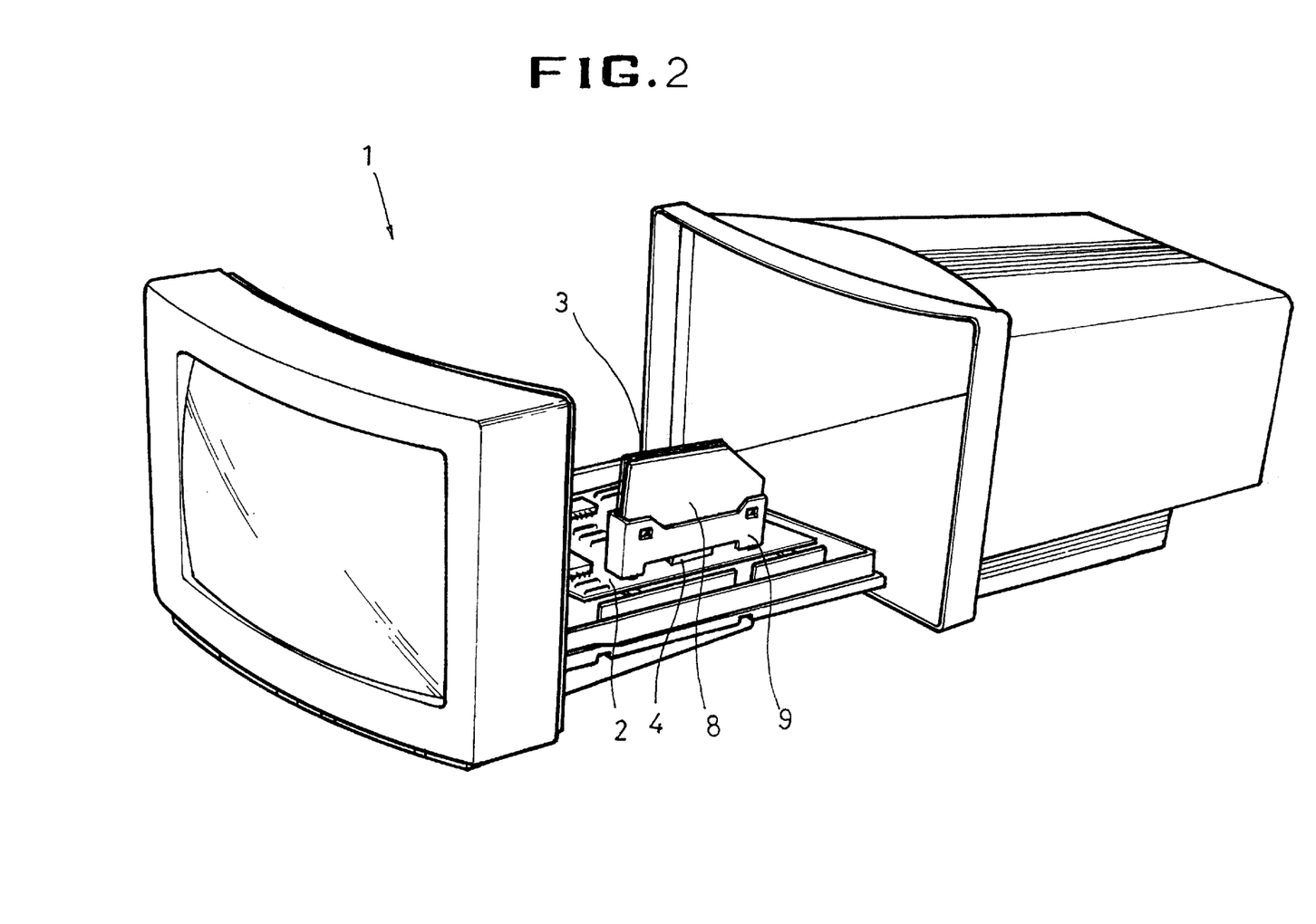
FIG. 2 is a perspective view of a disassembled electric production where the present invention is applied.

As shown in FIGS. 1 and 2, the present invention is made up of connector 4 formed on main PCB 2, for connection with sub PCB 3; connector pin 5 which is formed in the lower part of sub PCB 3 and inserted into connector 4; shield bracket 8 attached to sub PCB 3, for shielding effect; and fixing bracket 9 installed on main PCB 2, for removably fixing shield bracket 8 and sub PCB 3.

Many slits are formed in sub PCB 3 for joining shield bracket 8 with sub PCB 3. Curved projection 11 is integrally formed on shield bracket 8, thus shield bracket 8 is fastened to sub PCB 3 by folding or twisting projection 11 after inserting it through slit 10. Catches 12 and 12' and race 17 function as fasteners and are formed in one side of shield bracket 8 to prevent shield bracket 8 from dislocating from fixing bracket 9. Many hooks 14 are integrally formed in the bottom of fixing bracket 9, and inserted through holes 13 formed on main PCB 2 to fix bracket 9 to main PCB 2.

Garnering opening 15 is formed in fixing bracket 9 installed on main PCB 2, thus sub PCB 3 and shield bracket 8 are easily inset in fixing bracket 9. Apertures 16 and 16' and race catch 18 where catches 12 and 12' and race are kept, are formed in fixing bracket 9. Round and curved elastic lugs 19 and 19' are formed in both sides of fixing bracket 9 toward garnering opening 15 to precisely locate sub PCB 3.

Figure 3:
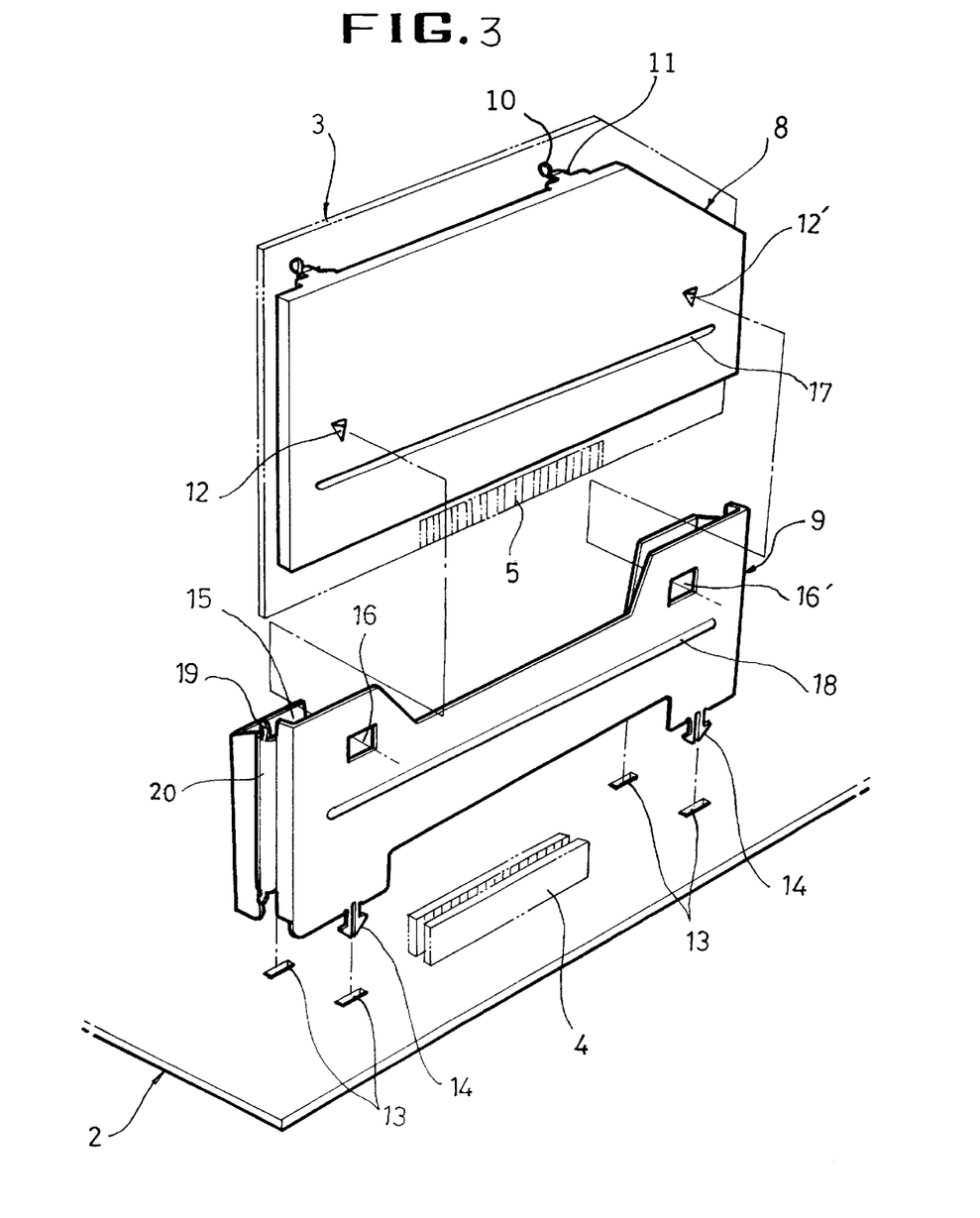
FIG. 3 is a perspective view of a disassembled PCB fixing device according to the present invention.
Figure 4:
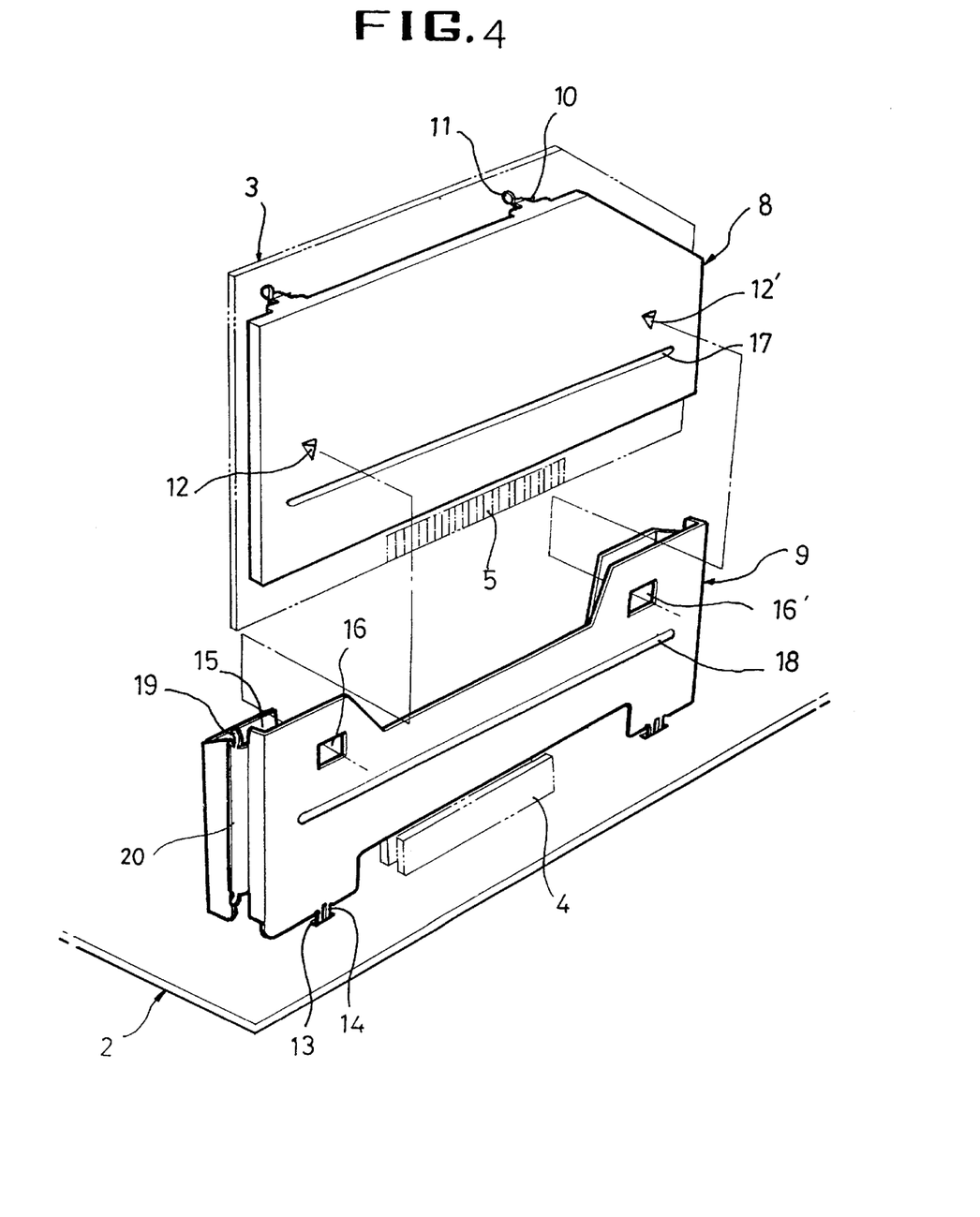
FIG. 4 is a partial perspective view of a disassembled PCB fixing device according to the present invention.

The effect of the embodiment according to the present invention is described below. As shown in FIGS. 3 and 4, curved projection 11 integrally formed on shield bracket 8 is inserted through slit 10 in sub PCB 3, then it is folded or twisted to firmly fasten shield bracket 8 to sub PCB 3. Shield bracket 8 can be fastened to sub PCB 3 using a hook or other fixing units.

Figure 5:
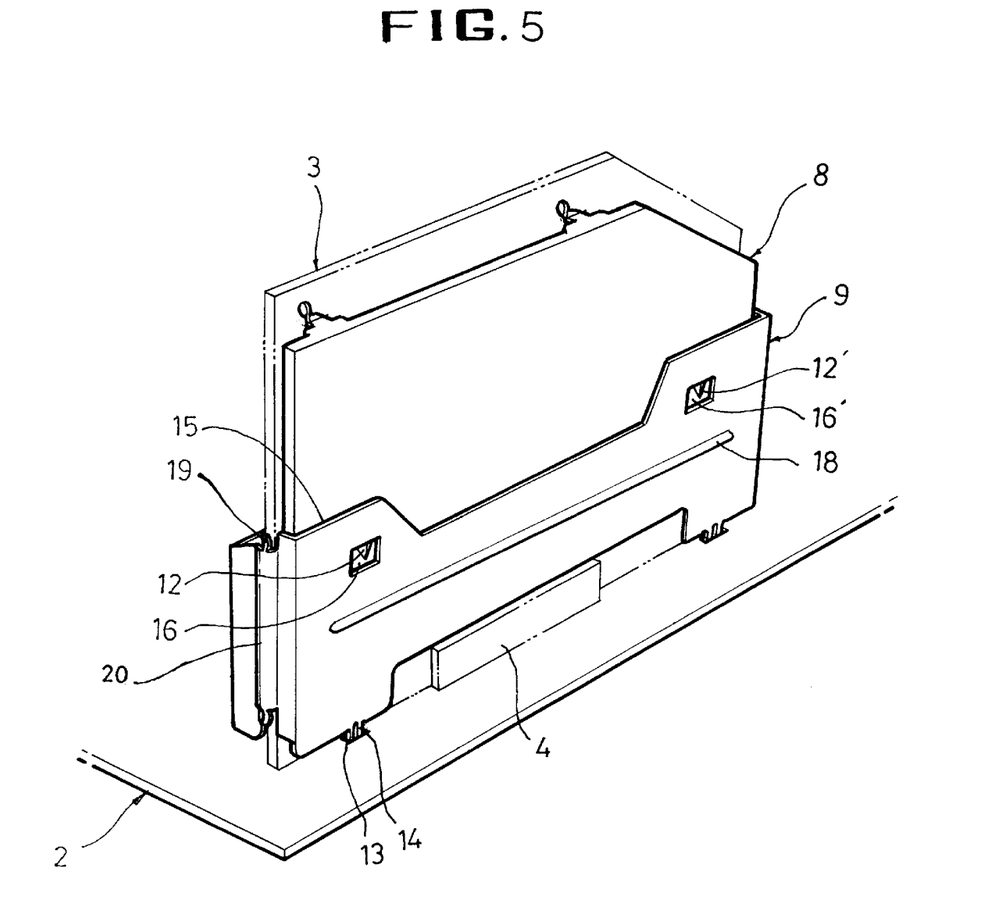
FIG. 5 is a perspective view of an assembled PCB fixing device according to the present invention.

After fastening shield bracket 8 to sub PCB 3, fixing bracket 9 is fixed to main PCB 2 in such a manner of inserting hook 14 integrally formed on the bottom of fixing bracket 9 through hole 13 formed in main PCB 2. Fixing bracket 9 can be more firmly fixed by folding hook 14 beneath main PCB 2 after inserting it through hole 13 and soldering it. Fixing intensity can be controlled by increasing or decreasing the number of hooks 14 depending upon the size of sub PCB 3. Sub PCB 3 joined with shield bracket 8 is then inserted into garnering opening 15 of fixing bracket 9 fixed to main PCB 2, thus sub PCB 3 is fixed to main PCB 2 as shown in FIG. 5.

Figure 6:
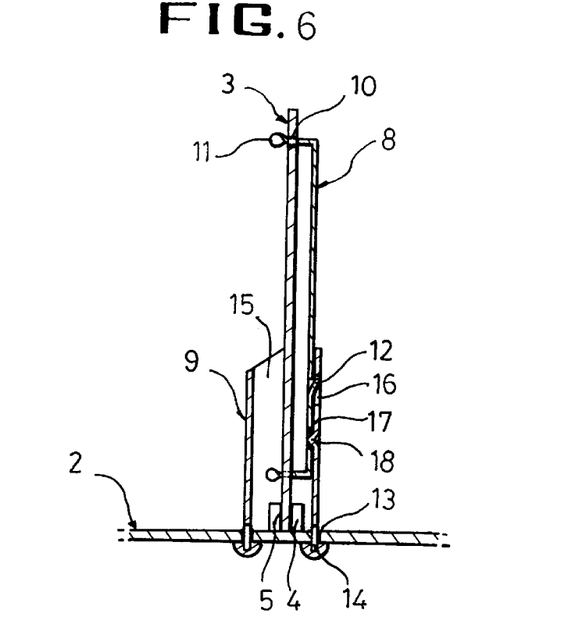
FIG. 6 is a sectional side elevation of the assembled present invention.

As shown in FIG. 6, connector pin 5 formed in the lower of sub PCB 3 is inserted into connector 4 installed on main PCB 2, thus electrical connection between sub PCB 3 and main PCB 2 is achieved. Catches 12 and 12' in shield bracket 8 are kept in apertures 16 and 16' in fixing bracket 9, and race 17 in shield bracket 8 is conjoined with race catch 18 in fixing bracket 9, thus shield bracket 8 is firmly fixed to fixing bracket 9, solidly fixing sub PCB 3 to main PCB 2.

Figure 7:
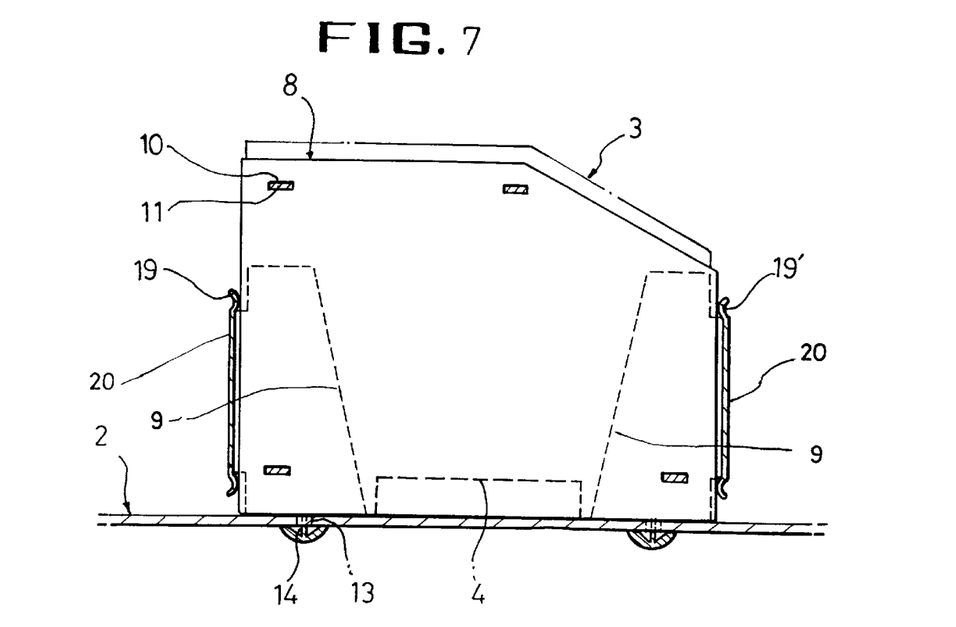
FIG. 7 is a front view of the assembled present invention.

As shown in FIG. 7, when insetting sub PCB 3 and shield bracket 8 into garnering opening in fixing bracket 9, elastic lugs 19 and 19' formed on both sides of fixing bracket 9 toward garnering opening 15 elastically clamp both ends of sub PCB 3, thus preventing sub PCB 3 from shaking. Guide grooves 20 formed on both sides of fixing bracket 9 guide sub PCB to locate it at the right place. Therefore, sub PCB 3 can be firmly fixed to main PCB 2, and connector pin 5 can be precisely inserted into connector, so operation efficiency in assembly can be improved. Elastic lugs 19 and 19' formed on both sides of fixing bracket must be curved toward garnering opening 15 to clamp sub PCB 3 more firmly and elastically.

According to the above assembly order, sub PCB 3 is vertically and fixedly mounted on main PCB 2. In case of repair or disassembly of sub PCB 3, sub PCB 3 fastened to shield bracket 8 can be easily disassembled from fixing bracket 9 by taking out catches 12 and 12' in shield bracket 8 from apertures 16 and 16' in fixing bracket 9. After finishing repair, the assembly can be easily completed by insetting shield bracket 8 into garnering opening 15 in fixing bracket 9 as described above.

Essentially, sub PCB 3, which has connector pin 5 and fastened to shield bracket 8, is inserted into garnering opening 15 in fixing bracket 9 which is fixed on main PCB 2. Shield bracket is then fastened to fixing bracket 9, and connector pin 5 in sub PCB is inserted into connector in main PCB 2, thus sub PCB 3 is electrically connected to main PCB 2. Therefore, sub PCB 3 is vertically and firmly fixed to main PCB 2 using shield and fixing brackets 8 and 9 in an electronic product, according to the present invention.

Since sub PCB 3 is electrically connected to main PCB 2 in an inserting method, not a soldering method, operation efficiency in connecting can be improved, and sub PCB 3 can be easily disassembled and assembled using shield and fixing brackets 8 and 9. Shield and fixing brackets 8 and 9 also implement solid fixation of sub PCB 3, thus sub PCB 3 is rarely dislocated even though it is dropped in a test or shocked. In case of repair, sub PCB 3 can be easily disassembled and assembled as described above, thereby improving the operation efficiency.

In this invention, as illustrated, a connector where a sub PCB is inserted, is installed on a main PCB; a connector pin, which is inserted into the connector, is formed in the lower part of the sub PCB, for an electrical connection; a shield bracket is fastened to the sub PCB, for shielding the PCB; and a fixing bracket having a catch and garnering opening is installed on the main PCB. The sub PCB, after fastened to the shield bracket, is installed on the main PCB and fixed to the fixing bracket. Consequently, electrical connection between the sub PCB and the main PCB is made in an insertion method without soldering, thereby improving efficiency in connecting operation.

According to the present invention, a sub PCB is conveniently assembled and disassembled using a shield and a fixing brackets. The two brackets also make the sub PCB solidly fixed to the main PCB. Even when the products are drop-tested or shocked, the connection between sub and main PCBs is rarely cut off, thereby decreasing inferiority rate in assembling products. In case of repair, the sub PCB, which is connected to the main PCB just by inserting its pin into the connector of the main PCB, can be easily disassembled, thereby improving operation efficiency in repairing. Additionally, this invention needs minimum space, thus increasing practicable space. This invention improves the shield effect and operation efficiency in assembly and disassembly, thereby increasing reliability and quality of the product as well as productivity.

It will be apparent to those skilled in the art that various modifications and variations can be made in a sub PCB fixing device of the present invention without deviating from the spirit or scope of the invention. Thus, it is intended that the present invention cover the modifications and variations of this invention provided they come within the scope of the appended claims and their equivalents.

What is claimed is:

1. A sub printed circuit board fixing device in an electronic product, the device comprising:
   an electrical connection installed on a main printed circuit board where a sub circuit board is inserted;
   connection means formed in the lower part of the sub printed circuit board and inserted into the electrical connection on the main printed circuit board;
   a shield bracket positioned to shield the sub printed circuit board and prevent electrical malfunction of said sub printed circuit board in said electrical product, wherein said sub printed circuit board comprises two faces, one of said two faces having integrated circuit chips mounted thereon, said shield covering only a substantial portion of said one of said two faces having integrated chips thereon; and
   a second bracket installed on the main printed circuit board, removably attaching the sub printed circuit board to which the shield bracket is fastened.

2. The device according to claim 1, wherein the sub printed circuit board contains many slits, and the shield bracket is fastened to the sub printed circuit board contains many projections for fastening the shield bracket to the sub printed circuit board.

3. The device according to claim 1, wherein the shield bracket has a catch on one face, preventing the bracket from dislocating, and functioning as a fastener when the shield bracket is inserted into the second bracket installed on the main printed circuit board, and the second bracket has a garnering opening where the sub printed circuit board and shield bracket can be easily inserted, and an aperture on a face of said second bracket for fastening the catch of the shield bracket.

4. The device according to claim 3, wherein the second bracket has a guide groove for guiding both ends of the sub printed circuit board to which the shield bracket is attached.

5. The device of claim 3, wherein said shield bracket comprises a race extending along in a direction perpendicular to a direction of insertion of said sub printed circuit board into said main printed circuit board, said fixing bracket having a race catch in operational relationship to said race on said shield bracket.

6. The device of claim 5, wherein said shield bracket is made of a material that shields electromagnetic interference.

7. The device according to claim 1, wherein a plurality of hooks are integrally formed in the lower part of the second bracket, the hooks being inserted through a plurality of holes formed on the main printed circuit board.

8. The device according to claim 1, wherein round elastic lugs are integrally formed on both sides of the second bracket and curved toward the garnering opening, for precisely locating the sub printed circuit board.

9. The device of claim 1, wherein said shield bracket comprises a race extending along in a direction perpendicular to a direction of insertion of said sub printed circuit board into said main printed circuit board, said fixing bracket having a race catch in operational relationship to said race on said shield bracket.

10. An electronic device, comprising:
    a main printed circuit board (main PCB) perforated by a plurality of holes;
    a subcircuit printed circuit board (subcircuit PCB) that electrically connects to said main circuit board, said subcircuit (PCB) being orthogonal to said main circuit board;
    a shield connected to said subcircuit board preventing electrical malfunction of said subcircuit board in said electronic device; and
    a fixing bracket physically connecting said subcircuit board and said shield to said main circuit board, said shield having a race that attaches to a race catch on said fixing bracket, holding said shield and said subcircuit PCB together in said fixing bracket, said race and said race catch oriented such that all points on said race and said race catch are equidistant from said main printed circuit board.

11. The electronic device of claim 10, said shield having catches on a face of said shield fastening to apertures found on a face of said fixing bracket, securing said shield to said fixing bracket.

12. The electronic device of claim 11, said fixing bracket containing a plurality of hooks that fasten to said plurality of apertures in said main PCB.

13. The electronic device of claim 11, said fixing bracket having guide grooves and a garnering opening for said guide grooves for accommodating said shield and said subcircuit PCB.

14. The electronic device of claim 11, wherein said sub printed circuit board comprises two faces, one of said two faces having integrated circuit chips and electronic components mounted thereon, said shield covering only a substantial portion of said one of said two faces having integrated chips and electronic components thereon.

15. The electronic device of claim 10, said shield having curved projections that fasten to slits formed in said subcircuit PCB.

16. The electronic device of claim 10, wherein said sub printed circuit board comprises two faces, one of said two faces having integrated circuit chips and electronic components mounted thereon, said shield covering only a substantial portion of said one of said two faces having integrated chips and electronic components thereon.

17. The device of claim 16, wherein said shield is made of a material that shields electromagnetic interference.

18. A method for assembling a sub printed circuit board onto a main printed circuit board in an electronic product, comprising the steps of:
    attaching a shield to said sub printed circuit board by inserting projections of said shield into holes in said sub printed circuit board, said shield preventing electrical malfunctioning of said sub printed circuit board in said electronic product, said shield covering only portions on a face of said sub printed circuit board that comprise integrated circuit chips and electrical circuit components;
    attaching a fixing bracket to said main printed circuit board by inserting a plurality of hooks protruding from a bottom of said fixing bracket into a plurality of through holes perforating said main printed circuit board; and
    attaching said shield and sub printed board assembly to said fixing bracket and main printed circuit board assembly by sliding said shield and sub printed circuit board assembly into a garnering opening in said fixing bracket until a connector pin at a bottom of said sub printed circuit board assembly electrically attaches to a connector on a face of said main printed circuit board.

19. The method of claim 18, wherein said step of attaching said shield and sub printed board assembly to said fixing bracket and main printed circuit board assembly further comprises the step of inserting a pair of catches on a face of said shield into apertures on said face of said fixing bracket thus securing said shield and sub printed board assembly to said fixing bracket and main printed circuit board assembly.

20. The method of claim 19, wherein said step of attaching said shield and sub printed board assembly to said fixing bracket and main printed circuit board assembly further comprises the step of inserting a race groove formed on said face of said shield into a race groove catch formed on said face of said fixing bracket thus further securing said shield and sub printed board assembly to said fixing bracket and main printed circuit board assembly, said race groove and said race groove catch being perpendicular to a direction of insertion of said sub printed circuit board assembly and shield onto said fixing bracket and said main printed circuit board.

21. The method of claim 20, wherein said step of attaching said shield and sub printed board assembly to said fixing bracket and main printed circuit board assembly further comprises the step of clamping said sub printed circuit board by a pair of elastic lugs preventing shaking of said sub printed circuit board.

* * * * *